United States Patent [19]
Fukuzawa et al.

[11] Patent Number: 5,281,543
[45] Date of Patent: Jan. 25, 1994

[54] FABRICATION METHOD FOR QUANTUM DEVICES IN COMPOUND SEMICONDUCTOR LAYERS

[75] Inventors: Tadashi Fukuzawa, Tokyo, Japan; Hiro Munekata, Mahopac, N.Y.

[73] Assignee: International Business Machines Corporation, Armonk, N.Y.

[21] Appl. No.: 912,939

[22] Filed: Jul. 13, 1992

Related U.S. Application Data

[62] Division of Ser. No. 701,925, May 17, 1991, Pat. No. 5,170,226.

[51] Int. Cl.$^5$ .......................................... H01L 21/265
[52] U.S. Cl. ........................................ 437/29; 437/107; 437/132; 437/133; 437/22; 257/14; 257/22; 257/78
[58] Field of Search ............... 437/107, 132, 133, 965, 437/29, 22; 257/14, 22, 78, 617

[56] References Cited

U.S. PATENT DOCUMENTS 4,503,447 3/1985 Iafrate et al. .................... 437/107

OTHER PUBLICATIONS

Warren et al. "Arsenic precipitates and the semi-insulating properties of GaAs Buffer layers grown by low-temp. MBE" in Appl. Phys. Letts 57(13), 1331-3 (1990).
Smith et al. "New MBE Buffer used to eliminate backgating in GaAs MOSFET's" in IEEE Electron Device Letters 9, 77-79 (1988).

*Primary Examiner*—Olik Chaudhuri
*Assistant Examiner*—Ramamohan Rao Paladugu
*Attorney, Agent, or Firm*—Blaney Harper; Robert M. Trepp

[57] ABSTRACT

Disclosed is a new method suitable for making highly integrated quantum wire arrays, quantum dot arrays in a single crystal compound semiconductor and FETs of less than 0.1 micron gate length. This makes it possible to construct a high-performance electronic device with high speed and low power consumption, using a combination of low-temperature-growth molecular beam epitaxy (LTG-MBE) and focused ion beam (FIB) implantation. The compound semiconductor (GaAs) epitaxial layers, which are made by LTG-MBE, are used as targets of Ga FIB implantation to make Ga wire or dot arrays. Precipitation of arsenic microcrystals, which are initially embedded in a single crystal GaAs layer and act as Schottky barriers, are typically observed in an LTG GaAs layer. A thermal annealing process, after implantation, changes the arsenic microcrystals to GaAs crystals if the arsenic microcrystals are in the region in which the Ga ions are implanted. A wire-like shape free of As microcrystals then acts as a quantum wire for electrons or holes whereas a dot-like shape free of As microcrystals acts as a quantum dot. The co-existence of Ga ions and dopant ions, which provides conductivity type carriers opposite to the conductivity type of the majority carriers of a channel region of an FET, provides the fabrication of very narrow junction gate region for any FET.

35 Claims, 9 Drawing Sheets

FABRICATION METHOD FOR QUANTUM DEVICES IN COMPOUND SEMICONDUCTOR LAYERS

This application is a divisional application of application Ser. No. 07/701,925, filed May 17, 1991, now U.S. Pat. No. 5170,226

BACKGROUND OF THE INVENTION

1. Field of the Invention

This invention relates generally to a method for fabricating semiconductor structures which contain at least a doped region in a compound semiconductor layer of III-V or II-VI elements with Group V or Group VI elements introduced therein, in excess amount, to form either microcrystals or point defects in the doped region and, more particularly, it relates to the fabrication of quantum structures in III-V compound layer such as GaAs. This invention is also directed to the fabrication of an improved FET structure which has a gate length less than 0.1 micron.

2. Description of the Prior Art

Electrons confined in a potential well whose size is comparable to that of the de Broglic wavelength of an electron behave quite differently from those in free space. This special behavior is called the quantum confined effect. One-dimensional plane. Two-dimensional confinement allows only one-dimensional motion of carriers: a structure with this feature is called a quantum wire or quantum well wire. Three-dimensional confinement does not allow kinetic motion of electrons, for example, in any direction. This electronic state is similar to those in atoms. An electron in this state is called a zero-dimensional electron and a structure that gives rise to this state is called a quantum dot or quantum box.

The difference in the dimensionality of these electrons causes quite a big difference in their density of states and electronic energy levels. Moreover, a remarkable improvement can be expected in the performance of devices that use the feature of electron kinematics in quantum structures of less than three dimensions. For example, an electron's mobility is related to the speed of an electronic feature of electron kinematics in quantum structures of less than three-dimensions. For example, an electron's mobility is related to the speed of an electronic device and its power consumption. This mobility is subject to electron scattering processes in semiconductors.

A quantum wire in which an electron has only one-dimensional freedom of kinetic motion allows only forward and backward scattering. Only backscattering reduces the mobility, but the probability of such scattering can be expected to be very low. Extraordinarily high mobility ($10^7$–$10^8$ sqcm/Vs) is predicted in the Japanese Journal of Applied Physics, Vol.19, No.12, December, 1980, pp.L735-L738 in an article entitled "Scattering Suppression and High-Mobility Effect of Size-Quantized Electrons in Ultrafine Semiconductor Wire Structures" by H. Sakaki. It is easy to understand the improvement, if we compare this value with that of bulk GaAs ($10^3$ sqcm/Vs).

There have been many attempts to make quantum wires and quantum boxes, in the hope of effecting a remarkable improvement in the device performance of electronic devices. However, these attempts have hitherto resulted only in rather large quantum wires whose quantum size effect is insufficient for practical purpose. These quantum wires also present many problems: lack of uniformity, low packing density and difficulty in obtaining a multi-layered structure and cleanliness in the fabrication process, which is important for subsequent crystal growth. Even if a quantum wire has high electron mobility, the current per quantum wire is so small that a large bundle of quantum wires is required to operate an actual electron device. This means that the size uniformity, high packing density, and multi-layered structure are indispensable for quantum wires.

Prior methods of fabricating quantum wires can be classified into four types, as summarized below. Except for molecular beam epitaxy (MBE), or metal organic chemical vapor deposition (MO-CVD), described at 4 below, grown quantum wells or superlattices are used for one-dimensional quantum confinement. Many different methods are used for additional confinement.

1. Etching Methods

1) Chemical Etching Method

A preferential chemical etching method used for making quantum wires was proposed in the Applied Physics Letter Vol.41 No.7, Oct. 1, 1982, pp.635-638 in an article entitled "Toward Quantum Well Wires: Fabrication and Optical Properties" by P. M. Petroff et al. The surfaces of a (111) Ga plane of GaAs have strong resistance to the etchant ($H_2SO_4$:$H_2O_2$:$H_2O$). This characteristic has been used to obtain a 200 Å quantum wire stripe-width from a two-micron mask pattern. However, this method lacks uniformity of quantum well size, high packing density structure, and the ability to process a multi-layered structure. A similar method was disclosed in the Journal of Crystal Growth 93, 1988, pp.365-369 in an article entitled "Fabrication Technique for GaInAsP/InP Quantum Wire Structure by LP-MOVPE" by P. Daste et al for making a GaInAsP quantum wire which has a 500 Å quantum wire stripe-width. This method is, however, subject to the same problems as the first mentioned approach.

2) Dry Etching Method

K. Kash et al applied a conventional dry etching method to MBE grown quantum well structures and obtained 400 Å±50 Å quantum wires, as reported in the Applied Physics Letter Vol.49 No.16, Oct. 20, 1986, pp.1043-1045 in an article entitled "Optical Spectroscopy of Ultrasmall Structures etched from quantum wells". A. Scherer et al also made quantum wires of 300 Å–400 Å stripe-width, as reported in an article entitled "Fabrication of Small Laterally Patterned Multiple Quantum Wells" in the Applied Physics Letter Vo.49 No.19, Nov. 10, 1986, pp.1284-1286. However, these dimensions are still insufficient to obtain a practical quantum size effect. In addition, the dry etching process causes damage and contamination to the semiconductor crystal. The fluctuation of the quantum well size, which originates from the dry etching resist, is also a problem.

2. Use of a Hetero-Interface or Metal-Oxide-Semiconductor (MOS) Structure Fabricated on an Edge of a Crystal The above-mentioned article by Sakaki et al proposed a conductive wire, that is electrostatically formed by a positive gate voltage, which induces an n-type inversion layer on a modified V-groove surface of a p-type quantum well structure. This method was extended to a quantum wire fabrication technique that relies on the MBE overgrowth of a cleaved multilayer MBE sample with modulation doping. L. Pfeiffer et al obtained a quantum wire, whose mobility is $4.8 \times 10^5$ sqcm/Vs, as reported in an article entitled "Formation of a High Quality Two-dimensional Electron Gas on Cleaved GaAs", in the Applied Physics Letter Vol.56, No.17, Apr. 23, 1990 pp.1697–1699. Although this value is quite high compared with that of a conventional semiconductor bulk crystal, only one cleaved facet can be used to make a quantum wire array. The disadvantage of the fabrication process, which requires formation on a wafer edge, makes it difficult to fabricate actual devices.

3. Partial Intermixing of the Micro-Hetero Structure

Impurity-induced disordering is a patternable process for locally mixing a compound semiconductive micro-hetero structure without losing its crystal quality. Under conditions of thermal diffusion or thermal annealing after ion implantation, impurity ions such as Zn or Si causes interdiffusion between Ga and Al atoms, which are component atoms in a III-V compound semiconductor. The intermixing of atoms forming the quantum structure makes the band gap larger than that without intermixing.

This intermixing was extended and combined with Ga focused ion beam implantation to make quantum wires or quantum boxes, as disclosed in Japanese Published Unexamined Patent Application (PUPA) 61-18192 and Japanese PUPA 62-36886, and in an article entitled "Optically Detected Carrier Confinement to One and Zero Dimension in GaAs Quantum Well Wires and Boxes" by J. Cibert et al in the Applied Physics Letter Vol.49, No.19, Nov. 10, 1986. In these prior art techniques, quantum structures, which are implanted with a pattern of linear arrays of focused Ga ion beams, change to linear arrays of mixed crystals, which act as barriers for linear arrays of quantum wires. Although this method preserves good crystal quality during the process, the thus obtained quantum wires or quantum dots have quite vague patterns in comparison with the original ion implanted patterns. This results from diffusion, which is the main cause of intermixing in this system. According to J. Cibert, there was no apparent formation of quantum wires when the mask pattern was smaller than 500 Å. This method is thus not appropriate process for making good quantum wires.

4. Crystal Growth on a Tilted Substrate

MBE or MO-CVD growth on a (001) GaAs substrate mis-oriented by several degrees from (110) gives direct growth of quantum wires. The crystal surface of the tilted substrate has many staircase-like steps with an atomic scale, which can act as nucleation centers for crystal growth. The crystal growth of each epitaxy layer starts from these steps.

Alternation between GaAs and AlAs molecular beams gives a lateral superlattice that is similar to a kind of quantum wire. The ratio between the GaAs and AlAs stripe-width can be controlled by the exposure time of each molecular beam. The size of the stripe-width can be controlled by selecting the tilted angle of the substrate, but the actual step size varies broadly. Although this method gives quantum wires with a stripe-width of 100 Å or less and also allows the integration of multilayers of quantum wire arrays, the well width fluctuation reduces the advantage of the quantum wire. M. Tsuchiya et al measured the spectral linewidth of photoluminescence from quantum wells and quantum wires, grown by this method at 3.7 meV and 7.7 meV, respectively, as reported in an article entitled "Optical Anisotropy in a Quantum-Well-Wire Array with Two-Dimensiona Quantum Confinement" in the Physical Review Letters, Vol.62, No.4, Jan. 23, 1989, pp.466–469. This line-width-broadening mechanism originates from the well-width fluctuation in the lateral direction of quantum wires.

In summary, all prior art techniques for making quantum wires or quantum dots involve difficulties in either the well size, the packing density, the direction of the substrate, or uniformity, thus reducing their effectiveness for actual usage in electronic devices or optical devices.

SUMMARY OF THE INVENTION

There is disclosed herein a novel fabrication method for semiconductor structures which allow several advantages over prior art methods. The use of structures fabricated by this method in various electronic devices is expected to result in a greatly enhanced performance.

It is known that epitaxial GaAs films grown at relatively low substrate temperatures 200°–250° Centigrade by molecular beam epitaxy exhibit high resistance and therefore very favorable insulating characteristics for buffer layers in metal-semiconductor field effect transistors, as disclosed in an article entitled "New MBE Buffer Used to Eliminate Backgating in GaAs MESFET's" by F. W. Smith et al in the IEEE Electron Device Letters, Vol.9, No.2, February 1988. pp.77–80. A mechanism for the high resistance is considered to be attributed to the presence of excess Arsenic (As) microcrystals imbedded in the GaAs single crystal layers, as reported in an article entitled "Arsenic Precipitates and the Semi-insulating Properties of GaAs Buffer Layers Grown by Low-Temperature Molecular Beam Epitaxy" by A. C. Warren et al in the Applied Physics Letter Vol.57 No.13, Sep. 24, 1990, pp.1331–1333 and in another article entitled "Formation of Arsenic Precipitates in GaAs Buffer Layers Grown by Molecular Beam Epitaxy at Low Substrate Temperatures" by M. R. Melloch in the Applied Physics Letter Vol.57 No.15, Oct. 8, 1990, pp.1531–1533. Each As microcrystal acts as a small metal particle, forming a Schottky barrier at the As/GaAs boundary and thus a carrier depletion region surrounding the microcrystal. Consequently, the entire GaAs layer becomes free from carriers under the condition at which the average As crystallite distance is close enough to let the depletion regions overlap each other. For example, the carrier concentrations that can be depleted have been estimated to be less than or equal to $2.2 \times 10^{18}$/cc for n-type and less than or equal to $1.6 \times 10^{18}$/cc for p-type with the As microcrystal concentration of $2 \times 10^{16}$/cc, assuming the barrier heights of 0.8 eV and 0.6 eV for electrons and holes respectively.

The concentration of As microcrystals or point defects in the form of vacancies or arsenic antesites is controllable by the MBE growth parameters, such as substrate temperature and As/Ga flux ratio. A highly resistive GaAs layer thus prepared shows more favorable insulating features than that of a Cr doped semi-insulating GaAs substrate, and is currently considered to be a promising material for device application. However, a method to permanently recover electronic conduction in the highly resistive layer has not yet been found in the prior art techniques.

The present invention provides an approach for recovering permanently the electronic conduction at an arbitrary area specified by the implantation of appropriate amounts of group III elements, that is, Ga+ ions, in the highly resistive layers which may be doped or undoped. At the area of implantation, the As microcrystals change into a GaAs single crystal phase through the reaction Ga+As→GaAs after an appropriate annealing step, resulting in the elimination of carrier depleted regions. This makes it possible to generate and confine carriers inside of the implanted regions in doped but highly resistive target GaAs layers which contain excess As microcrystals or point defects.

Co-implantation of ions of Group III elements and Group II elements provides semiconductor single crystal regions which have holes, and co-implantation of ions of Group III elements and Group IV elements provide a region with electrons as carriers after an appropriate annealing step. This makes it possible to generate and confine both p- and n-type carriers inside of the implanted regions even if the target III-V semiconductor layer is undoped. Use of this technique can provide devices such as GaAs short channel devices which have high-speed performance and which can be integrated in both lateral and vertical directions. At this point, it should be appreciated, that while GaAs has been discussed by way of example, other compound semiconductors such as semiconductors, made from the II-VI elements may also be utilized. In addition, binary, ternary and quaternary compounds of both III-V and II-VI elements may be used in the practice of the present invention.

DESCRIPTION OF THE PREFERRED EMBODIMENT

Throughout the following description, the same reference numbers refer to the same elements in all the figures.

EXAMPLE 1

Quantum Wires

Figure 1A:
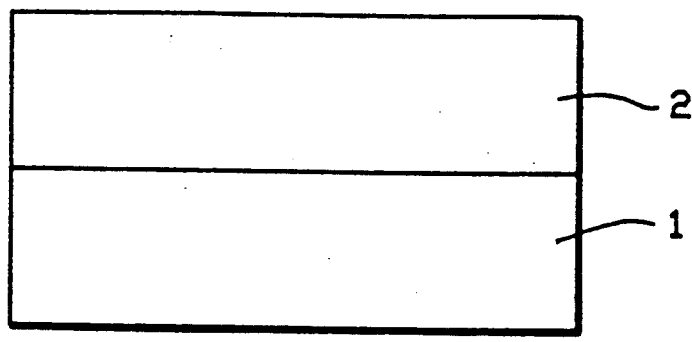
FIGS. 1A through 1C show fabrication process of GaAs wires.
Figure 1B:
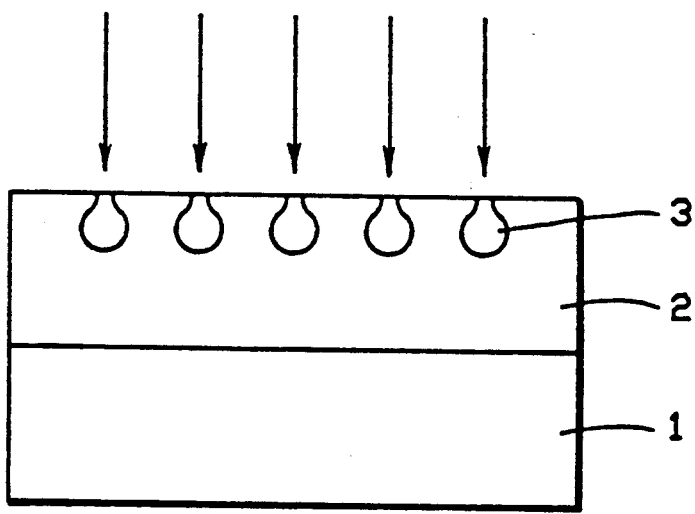
Figure 1C:
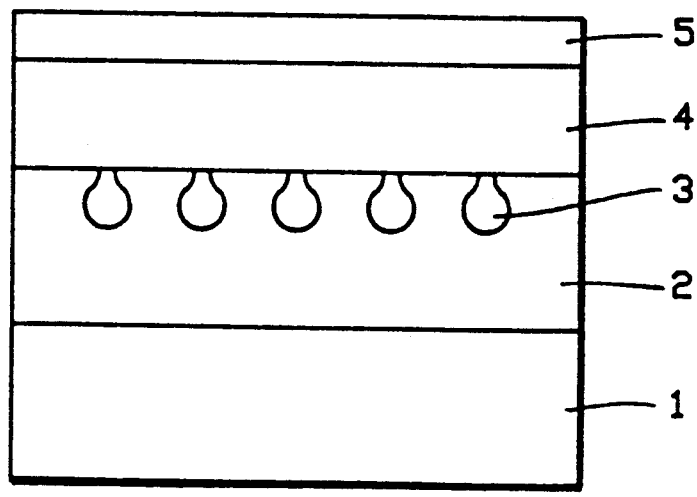

The first example is the fabrication of quantum wires, which is schematically illustrated in FIG. 1A-FIG. 1C. A 1-micron thick, highly resistive GaAs (doped with $Si=1\times10^{17}/cc$) layer 2 is first grown on a semi-insulating GaAs (100) substrate 1 by molecular beam epitaxy (MBE) at a substrate temperature of 200° Centigrade with $As_4$/Ga flux ratio of less than 16, as illustrated in FIG. 1A. The growth rate is 1 micron/hr. The estimated concentration of As microcrystals in bulk layer 2 is $10^{16}$-$10^{17}$ atoms/cc. A microcrystal, typically a 50 Å cluster, consists of $2\times10^3$ As atoms on average. The sample is then transferred through ultrahigh vacuum transfer modules to a focused ion beam (FIB) chamber for the Ga writing from which quantum wires are ultimately formed. The Ga writing is performed by using a Ga+ focused ion beam having a beam diameter of 0.25 micron to form an array of straight Ga regions 3. The array may consist of 100 such regions 3. The dose is $10^{14}$Ga+/sqcm. The acceleration voltage and beam current are 150 keV and 100 pA, respectively, so that the ion-implantation depth is 0.15 micron. The concentration of implanted Ga is $2\times10^{19}$-$2\times10^{20}$ atoms/cc. A cross-sectional view of such Ga-implanted region is shown as region 3 in FIG. 1B. A top view of the array of Ga regions 3 can also be seen in FIG. 2. The length of each Ga-implanted region 3 is 50 microns, and the spacing between two consecutive regions 3 is 0.1 micron.

After the Ga writing is completed, the sample is transferred back to the MBE growth chamber where a second low temperature GaAs layer 4 (FIG. 1C) of 0.1 micron thickness is grown on top of the layer 2 at the same growth conditions as specified for the growth of layer 2. Note, however, that the layer 4 is intentionally undoped. This is followed by the growth of a 0.1 micron thick undoped GaAs cap layer 5 (FIG. 1C). This step is performed at a substrate temperature of 580°-600° Centigrade.

Figure 2:
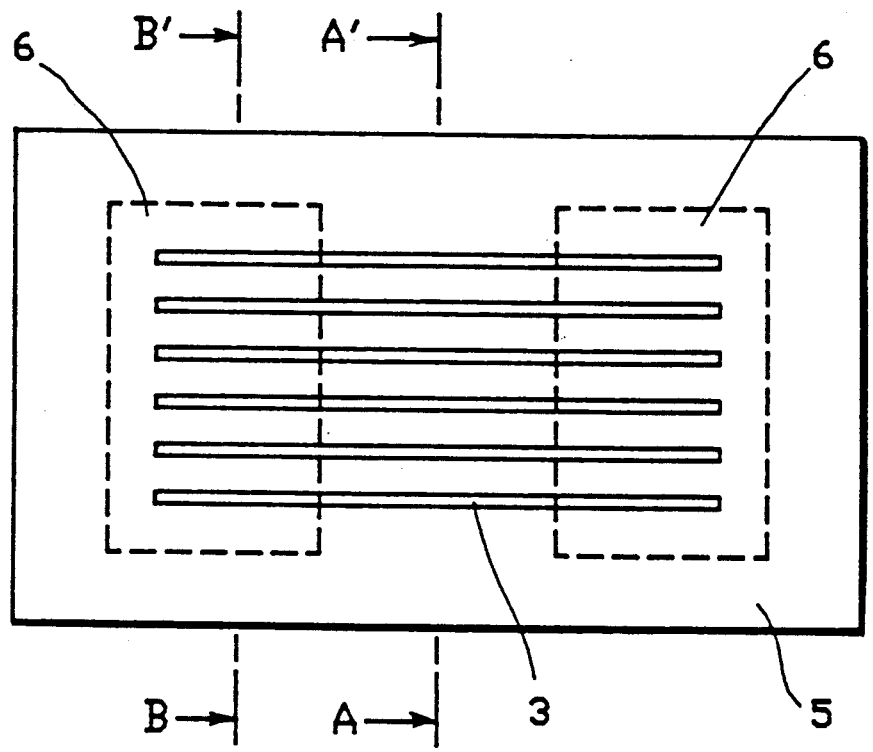
FIG. 2 is a top view of a wire structure with electrical contacts.
Figure 3:
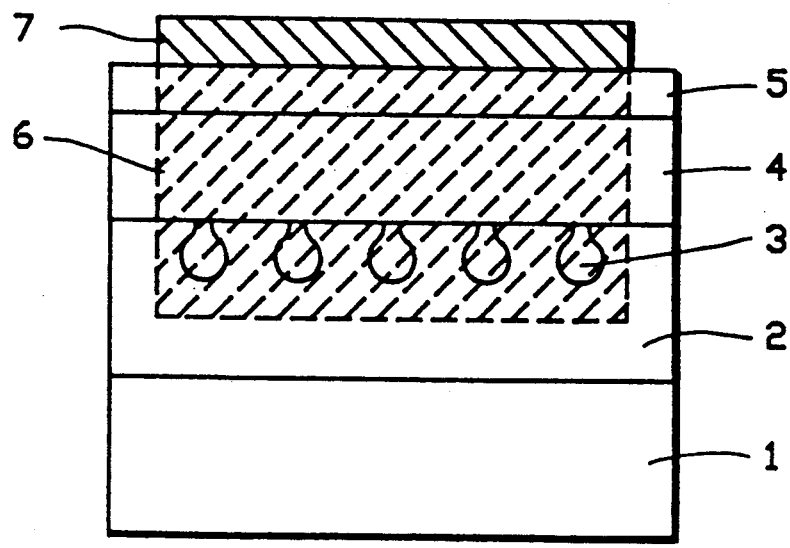
FIG. 3 is a cross section view of contact region.

Finally, the sample is again transferred to the FIB chamber, and Si+ and Ga+ ions are co-implanted in a pattern 6 at both ends of the array of regions 3 as shown in FIG. 2. The alignment between the array of regions 3 and pattern 6 viewed from the sample surface is also shown in FIG. 2. Note that the array of regions 3 is embedded in highly resistive GaAs as shown in FIG. 1C, which corresponds to a cross section A-A' in FIG. 2. The implantation depth has to be deep (about 0.2 micron) enough to reach the embedded array of regions 3. A cross section of the implanted region B-B' is also shown in FIG. 3 for comparison. The purpose of this process is to establish electrical contact from the top surface to the array of regions 3, so the beam size can be rather large (about 1 micron) compared to the previous Ga writing process. The co-implantation step is followed by either laser flash annealing or other rapid thermal annealing step to recover the crystal quality of regions 3 and co-implanted regions 6, and then by the formation of n-type ohmic contact pads 7 (FIG. 3) on top of regions 6. After annealing, regions 3 and 6 have been recovered or converted to conductive regions of GaAs in the form of quantum wires. The steps involved in the electrical contact fabrication are similar to those used in conventional semiconductor device processing.

The resulting structure is then subjected to transport measurements to determine its characteristics. Finite conductance ($2 \times 10^{-4}$ mho) is observed together with characteristic magnetotransport behavior, both indicative of the presence of electrons in the recovered GaAs wires. An effective wire diameter is estimated to be about 30 nm, taking account of a depletion region which extends from outside to inside of the GaAs wires. 30 nm is sufficiently less than the de Broglie wavelength of electrons or holes to permit the quantum size effects such as high electron mobility.

Figure 4:
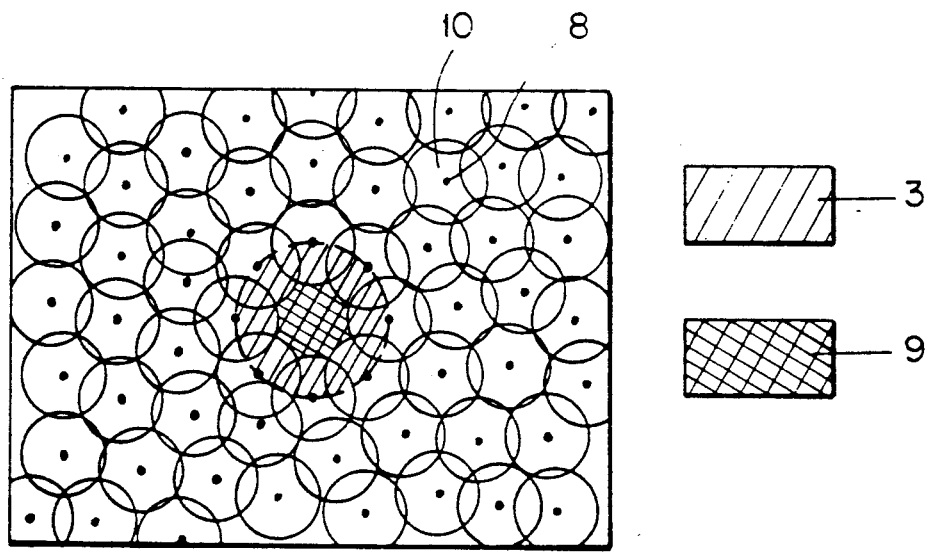
FIG. 4 is an illustration of depletion region caused by Arsenic microcrystal and quantum wire fabricated therein.

The formation mechanism of quantum wires in highly resistive GaAs can be understood by considering FIG. 4. Note that FIG. 4 is an enlargement of the tube-like shape of ion-implanted regions 3 and As microcrystals 8 after GaAs layer 4 is grown. The solid state reaction Ga+As→GaAs occurs in the regions 3 where Ga+ ions are implanted in a concentration of As microcrystals 8 so as to return regions 3 to stoichiometry. This results in the appearance of a specific region 9 which is undepleted as compared with depleted region 10. Thus, carriers which are electrons for Si-doped GaAs are confined in region 9. Annealing effects during the cap layer growth (at 580°-600° Centigrade) and after the second ion implantation also promote reactions for GaAs formation and recrystallization which results in conductive regions 9.

Note that the width or diameter of a region 3 is determined by not only the ion beam diameter but also by the extension of the depletion regions 10 from the surrounding As microcrystals 8. The latter is determined by the concentration of microcrystals 8 which is controllable by the substrate temperature, the $As_4$/Ga flux ratio during the MBE-growth step and the silicon concentration. Similarly, the wire depth, or the size in a vertical direction of FIG. 4 is determined by the ion-implantation depth and the above MBE parameters. The former is controlled by ion-implantation parameters such as beam acceleration voltage and current.

EXAMPLE 2

Stack of Wire Arrays

Figure 5:
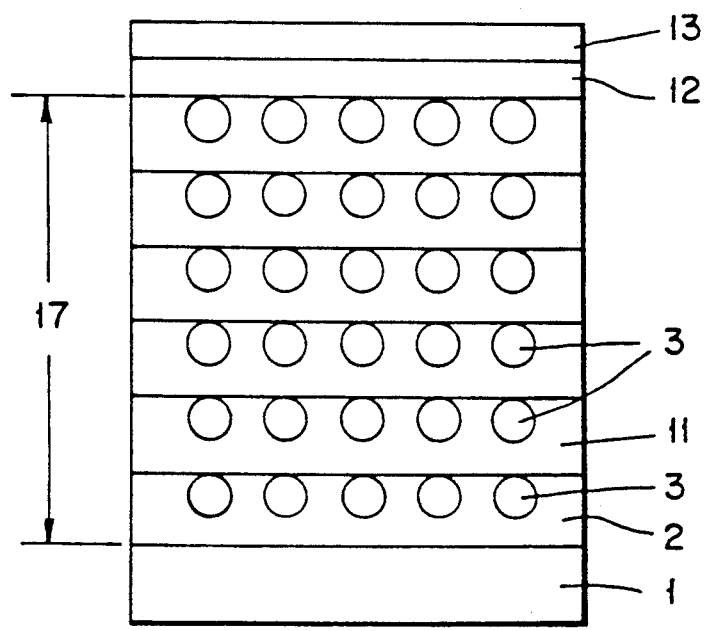
FIG. 5 shows fabrication process for stacked GaAs wires structure.
Figure 6:
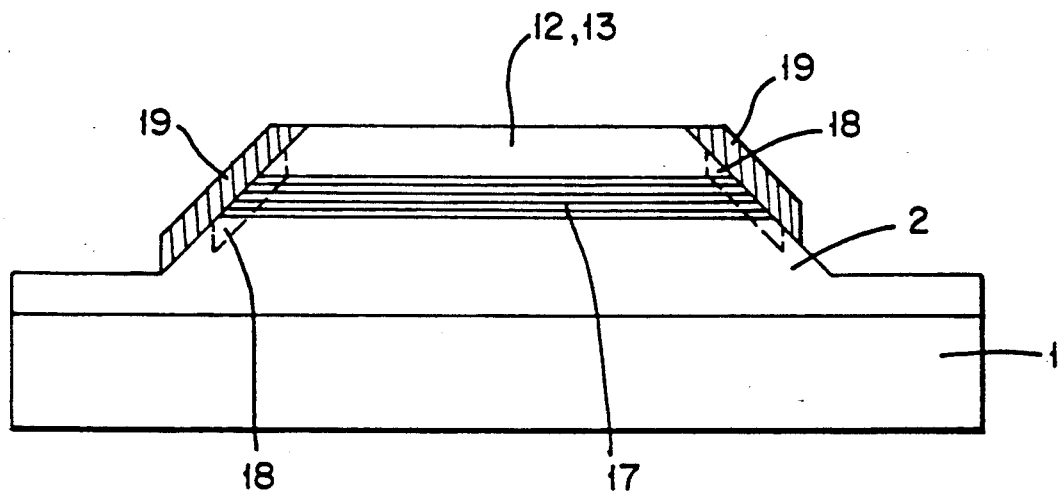
FIG. 6 is a side view of a stacked wire structure with side contacts.

The second example of wire arrays is schematically illustrated as an end view in FIG. 5. The first row of the array of Ga wires 3 is fabricated in the same fashion as described in example 1. A second GaAs layer 11 is then grown on top of layer 2, embedding first row of wires 3 underneath it, followed by the successive fabrication of a second row of Ga wires 3 on top of layer 11. Layer 11 is grown under the same growth condition as layer 2. The fabrication process of Ga wires 3 is repeated six times in total forming structure 17, and then, undoped low temperature (200° Centigrade) and high temperature (600° Centigrade) GaAs cap layers 12 and 13 are grown on top of layers of wires 3. The quantum wire structure 17 composed of six rows of GaAs wires 3 prepared as above, is shown in FIG. 6 as a side view of FIG. 5. In this case, the electrical contact is achieved by side wall contacts 19 in a mesa structure fabricated by conventional lithography techniques. An edge of the top of the mesa is aligned perpendicular to the axis of wires 3. The contact formation is done at the mesa edges 18 (FIG. 6) by co-implantation of Ga+ and Si+ ions by FIB, followed by rapid thermal annealing and n-type metallurgy 19. Magnetotransport behavior through two contact probes shows the existence of electrons confined in the GaAs wires 3, and, thus, confirms the formation of quantum wires.

EXAMPLE 3

Quantum Dots

Figure 7:
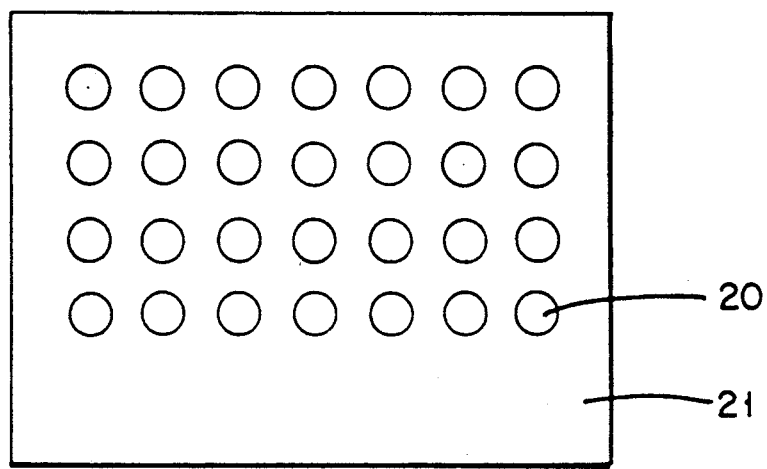
FIG. 7 is a top view of Ga implanted regions in forms of dots.

An array of Ga dots 20 is fabricated in a low temperature grown GaAs layer 21, as seen on the top view of the sample surface of layer 27 (FIG. 7). Ga+ ions are implanted in the form of an array of dots each with a diameter of 0.2 micron. Repetition of the growth and dot fabrication process like Example 2 yields a stack of arrays of dots (15,000 dots). After an annealing step, the sample is evaluated by infrared reflection spectroscopy in which reflectance modulation is observed at the photon energies corresponding to those of confined states in a quantum dot of about 30 nm diameter. Such a structure can transform electromagnetic waves from one frequency to another and also act as a polarizer.

EXAMPLE 4 p-type Wires

An array of Ga wires 3 is fabricated in a same way as described in connection with Example 1. The host GaAs layer (layer 2 in FIG. 1) in this case, however, is intentionally doped with an acceptor impurity Be. The GaAs:Be layer is grown by MBE at the substrate temperature 200°-250° Centigrade with $As_4$/Ga flux ratio of less than 16; the same as the GaAs layer 2 in Example 1. In the electrical contact process, Be+ ions are used instead of Si+ ions because of the p-type contacts. A conductance of about $10^{-5}$ mho/100 wires is observed together with characteristic magnetotransport behavior indicative of the carrier confinement.

The resulting quantum wire and dot structures have a wide range of application. For example, p- or n-type wires are used for channel regions for ultrasmall and fast FETs which are smaller than FETs described below in Examples 5 to 8. A quantum dot array may be used as a micro switching device, as described in Scientific American, March, 1988, pp. 96 to 100, in an article entitled "The Quantum-Effect Device: Tomorrow's Transistor" by R. T. Bate.

EXAMPLE 5

Short Channel FETs

Figure 8A:
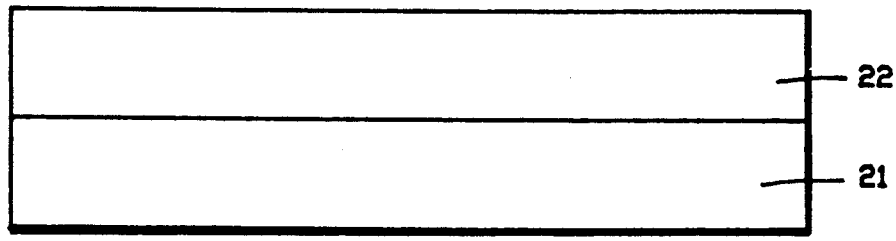
FIGS. 8A through 8E show fabrication process of short channel GaAs FET.
Figure 8B:
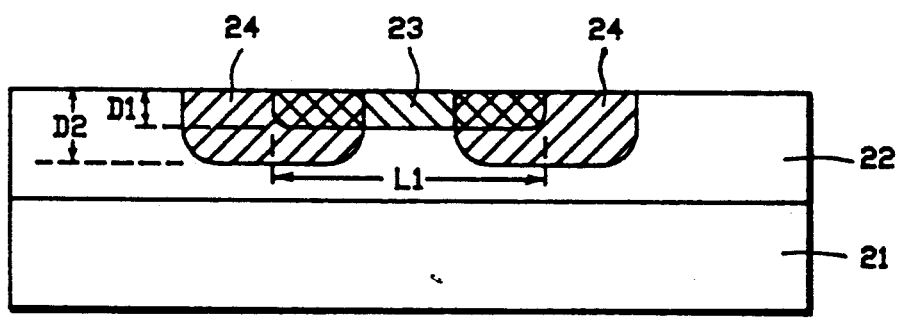
Figure 8C:
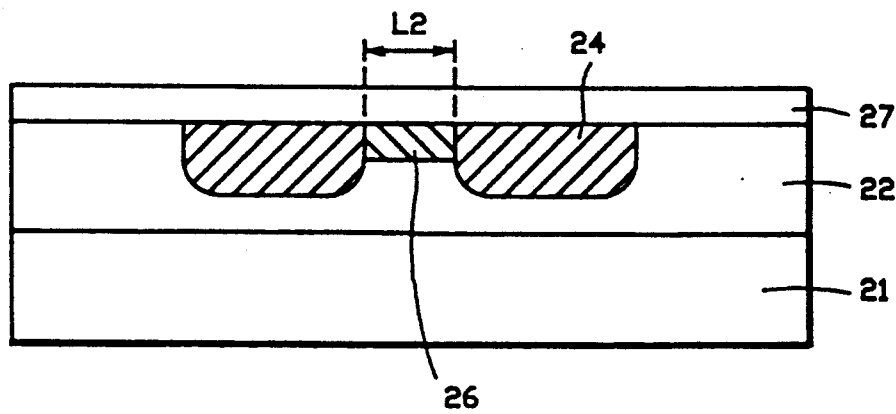

The fifth example shows the fabrication of a short channel GaAs FET, which is schematically illustrated in FIGS. 8A-8E. A 1-micron thick, highly resistive GaAs ($Si = 1 \times 10^{17}$/cc) layer 22 is first grown on a semi-insulating GaAs (100) substrate 21 by molecular beam epitaxy (MBE) at the substrate temperature of 200° Centigrade with $As_4$/Ga flux ratio less than 16, as illustrated in FIG. 8A. The growth rate is 1 micron/hr. The estimated concentration of As microcrystal in layer 2 is $10^{16}$–$10^{17}$ atoms/cc. The sample is then transferred through ultrahigh vacuum transfer modules to a focused ion beam (FIB) chamber for the Ga pattern writing. Pattern 23 (which may be rectangular) is written by using a Ga+ focused ion beam of a beam diameter of 0.25 micron to form an n-type region. The dose is $1 \times 10^{14}$Ga+/sqcm. The concentration of the implanted Ga is $10^{19}$–$10^{20}$atoms/cc. A cross-sectional view of such Ga-implanted region 23 is shown in FIG. 8B. The length of region 23, indicated as L1 in FIG. 8B, is 5 microns and the implantation depth, indicated as D1, is 150 nm (0.15 micron). The remaining dimension of region 23 is 50 micron. In a subsequent step, writing of rectangular pattern 24 is carried out by using a Ga+ and Si+ focused ion beam of a beam diameter 0.25 micron to form n+ type source and drain regions. In this FIB process, the density of Si is controlled to obtain a constant value (Si=$10^{18}$ atoms/cc) for the region 24. The density of implanted Ga is also controlled to obtain a constant value of (Ga=$2 \times 10^{19}$-$2 \times 10^{20}$ atoms/cc) for the region 24. The achieved ion-implantation depth, indicated as D2, is 250 nm. The remaining portion of region 23 shown as n-type region 26 between two regions 24 becomes channel for the FET as shown in FIG. 8C. The effective n-type channel length of region 26, indicated as L2 in FIG. 8C, is 0.09 micron.

After the writing is completed, the sample is transferred back to the MBE growth chamber where a second low temperature GaAs layer 27 (FIG. 8C) of 0.1 micron thickness is grown on top of the layer 22 under the same growth conditions as layer 22. Note, however, that the layer 27 is intentionally undoped.

Figure 8D:
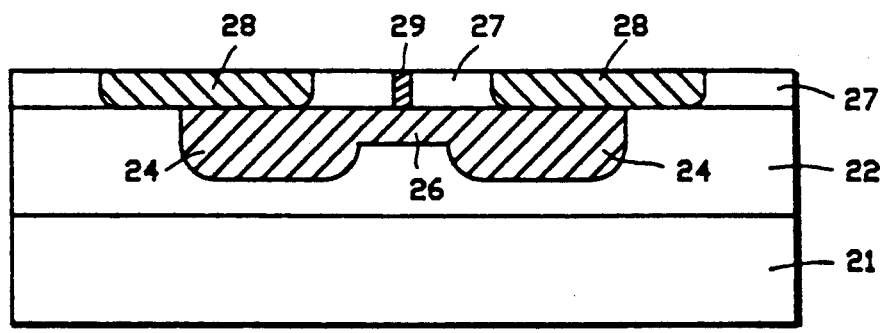

Finally, the sample is again transferred to the FIB chamber, and Si+ and Ga+ ions are co-implanted in pattern 28 at both ends of n+ region 24 as shown in FIG. 8D. Be+ and Ga+ ions are co-implanted to form gate region 29, which has a 0.05 micron effective gate length.

The implantation depth has to be deep enough (about 0.11 micron) to reach the embedded regions 24 and 26. This is followed by either laser flash annealing or other rapid thermal annealing techniques to recover the crystal quality of the implanted regions 24 and 26 and n-type ohmic contact pads 28 and p-type gate 29 on top of the region 26. Thus, the channel, source, drain and gate regions are fabricated using a maskless FIB technique.

Figure 8E:
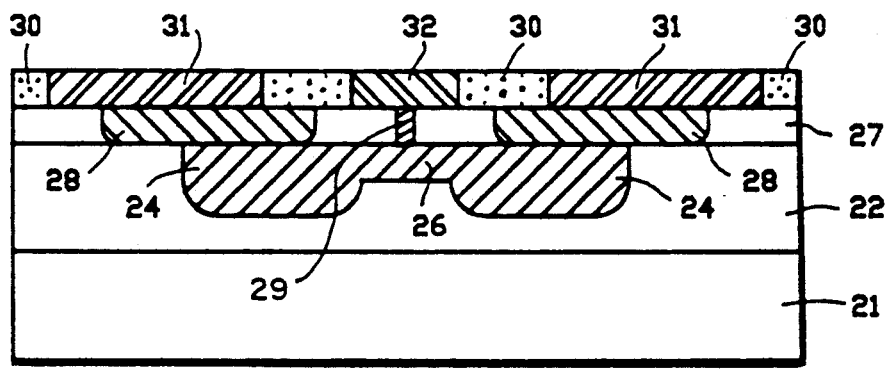

The subsequent processes involved in the electrical contact fabrication are similar to those used in a conventional semiconductor device fabrication process. In FIG. 8E, ohmic electrodes 31 for n-type regions 28 are made of Au/Ge/Ni and contact 32 made of p-type $WN_x$ to gate 29 are deposited through holes in insulating layer 30. Thus, the obtained FET has a planar structure suitable for various kinds of subsequent processes.

The annealing step should be performed before ohmic electrodes 31, 32 are fabricated. Preferably the annealing should be done after insulating layer 30 is formed over layer 27, but it can be done before layer 30 is formed if it is carried out in an arsenic atmosphere.

Figure 9A:
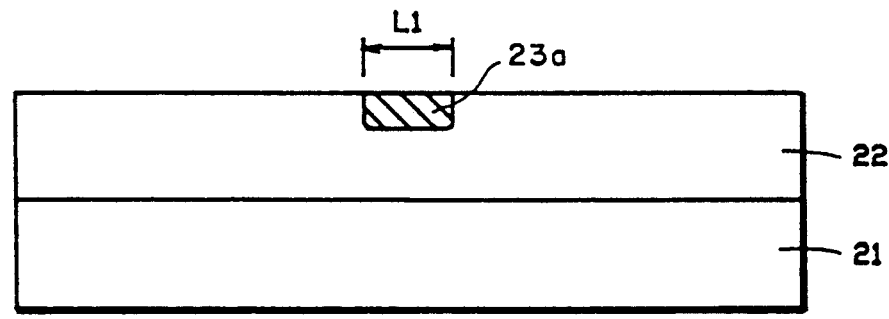
FIGS. 9A and 9B show alternative fabrication process of short channel GaAs FET.
Figure 9B:
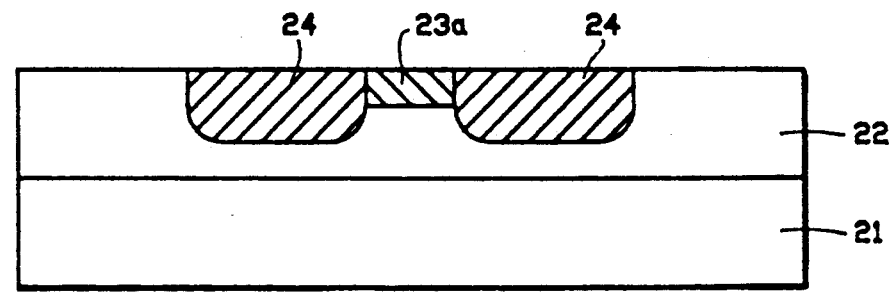

The fabrication steps shown in FIGS. 8B and 8C have an alternative as shown in FIGS. 9A and 9B. In this alternative process, n-type region 23a is first formed in GaAs layer 22. Region 23a is formed in a same manner as region 23 except that the length L1 is 0.09 micron (FIG. 9A). Then regions 24 are formed on both sides of the region 23a (FIG. 9B).

Formation of the short channel GaAs FET is attributable to the solid reaction Ga+As→GaAs occurring in the regions 23, 24, 28 and 29 where Ga+ ions are implanted in such concentration that the As microcrystals are converted to crystalline GaAs.

The resulting normally-off, junction FET is characterized by current-voltage measurements for various gate biases. The transconductance 1.2S/mm is observed without hysterisis in its I-V characteristics.

Figure 10:
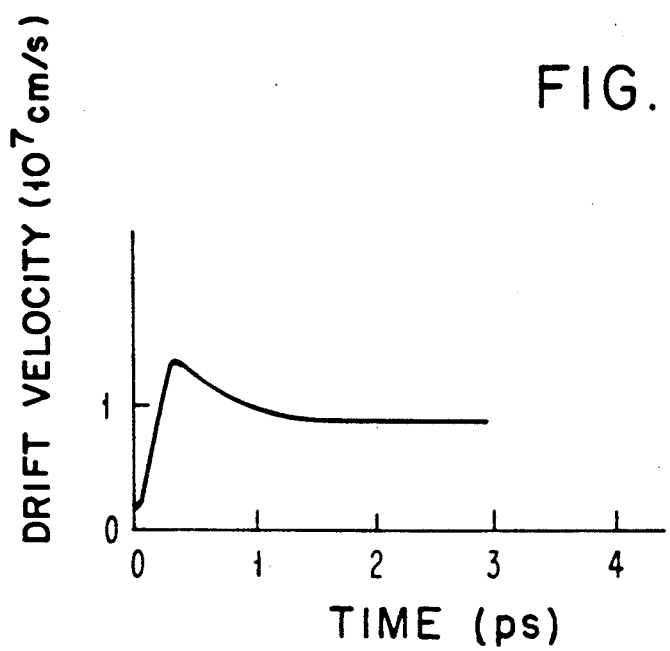
FIG. 10 is a graph showing a transient response of electron drift velocity in Si.
Figure 11:
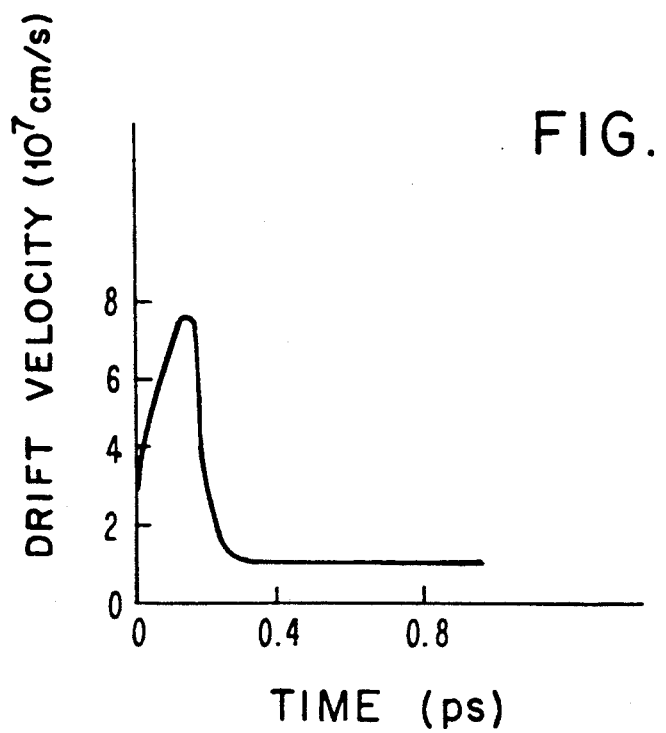
FIGS. 11 and 12 are graphs showing a transient response of electron drift velocity in GaAs.

The performance of an FET fabricated according to the above-mentioned steps is explained below. In electronic devices, a drift velocity of carriers under electric field has significant meaning to determine the device performance, especially its speed and power consumption. The drift velocity in semiconductors depends on the electronic structures of the channel which transports the carriers. FIG. 10 shows a transient response of electron drift velocity of n-type silicon obtained by the Monte Carlo method. A similar transient response for n-type GaAs is shown in FIG. 11.

Figure 12:
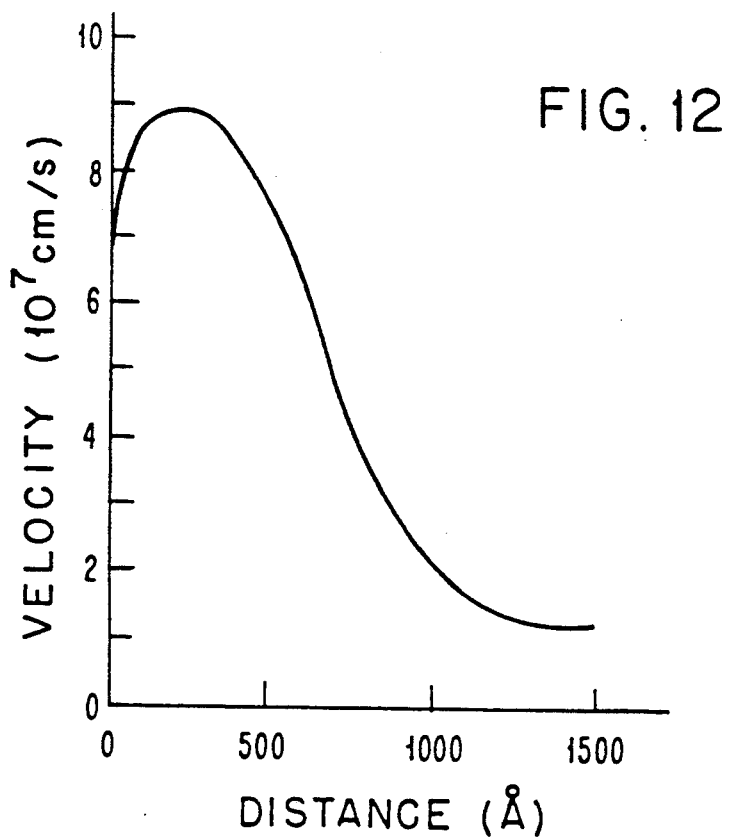

From these figures it should be clear that GaAs electronic devices can be expected to have switching speeds on the order of half a picosecond. If the transit time of electrons exceeds several picoseconds, the relationship shown in FIG. 11 need not be used. Alternatively, FIG. 11 may be recast as FIG. 12 which shows the electron drift velocity change along the channel distance which is obtained by using the Monte Carlo technique.

The shortest channel length in FET devices is 0.1 micron in Si metal-oxide-semiconductor (MOS) FET structures as reported by G. A. Sai-IIalasz in an article entitled "Experimental Technology and Performance of 0.1 micron Gate-Length Low Temperature Operation MOSFETs", in the Extended Abstracts of the 20th Conference on Solid State Devices and Materials, Tokyo, 1988, pp. 5-8. This extremely short channel was obtained not in GaAs but in silicon. This indicates that for the same channel length, higher switching speed can be obtained in GaAs.

In GaAs devices, such as metal-semiconductor (MES) FET, a more complicated fabrication process is required, even for 0.5 micron length, compared to Si MOS-FET technology, as described by K. Ishida ct al in an article entitled "A 5 Gb/s 4 Bit Shift Register with 0.5 micron $WN_x$-gate GaAs MESFETs", in the Extended Abstracts of the 20th Conference on Solid State Devices and Materials, Tokyo, 1988, pp. 129-132. In the case of GaAs, high speed, reliable device was not achieved by the prior art techniques because (1) the short channel effect could not be fully utilized and (2) punch-through effects could not be prevented.

In contrast, the GaAs device obtained by the above-mentioned method has a very short channel and thus has high-speed performance. High resistivity layer 22 prevents punch-through effects from which the conventional GaAs FETs with short gate length suffered. In addition, a gate region less than 0.1 micron in length can be fabricated easily using a maskless FIB technique.

EXAMPLE 6

Normally-On and Off Type FETs

Figure 13A:
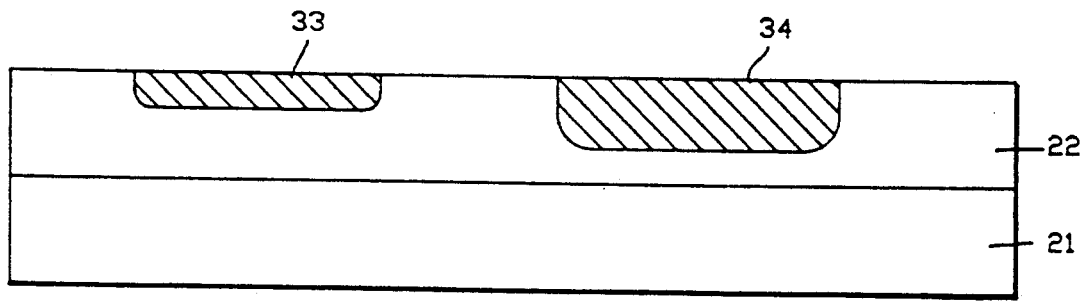
FIGS. 13A and 13B show fabrication process of short channel GaAs FET for normally-off and on devices.
Figure 13B:
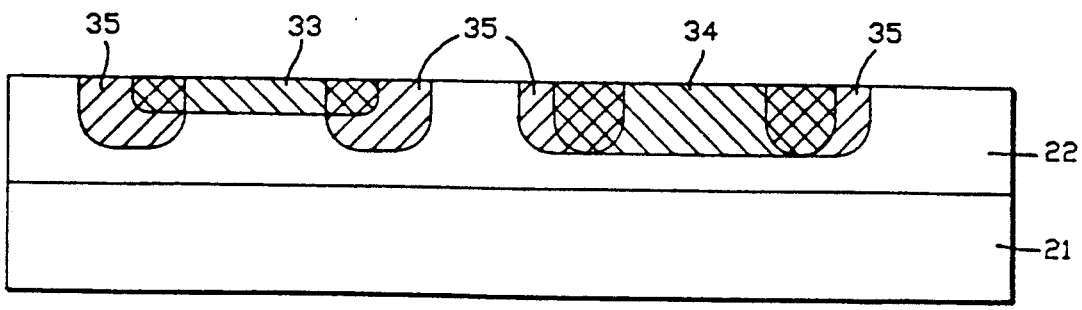

The sixth example of short channel FETs are schematically illustrated in FIGS. 13A and 13B. The n-type region 33 for a normally-off FET is fabricated in the same fashion as described in Example 5, and the n-type region 34 for a normally-on FET is fabricated by increasing both the beam acceleration voltage and current. The depth of region 33 is 150 nm and that of region 34 is 250 nm. The following fabrication process is the same as that described in connection with Example 5. Source and drain regions 35 are formed in a similar way for normally-on and normally-off FETs. An integrated circuit is obtained with this normally-off and on FET combination. The advantage specific to this example is that the source, drain and channel regions for both normally-on FET and a normally off FET is that they are fabricated on the as-formed surface of a GaAs crystal layer, as shown in FIG. 13.

EXAMPLE 7

Three-Dimensional Integration of Short Channel FETs

Figure 14:
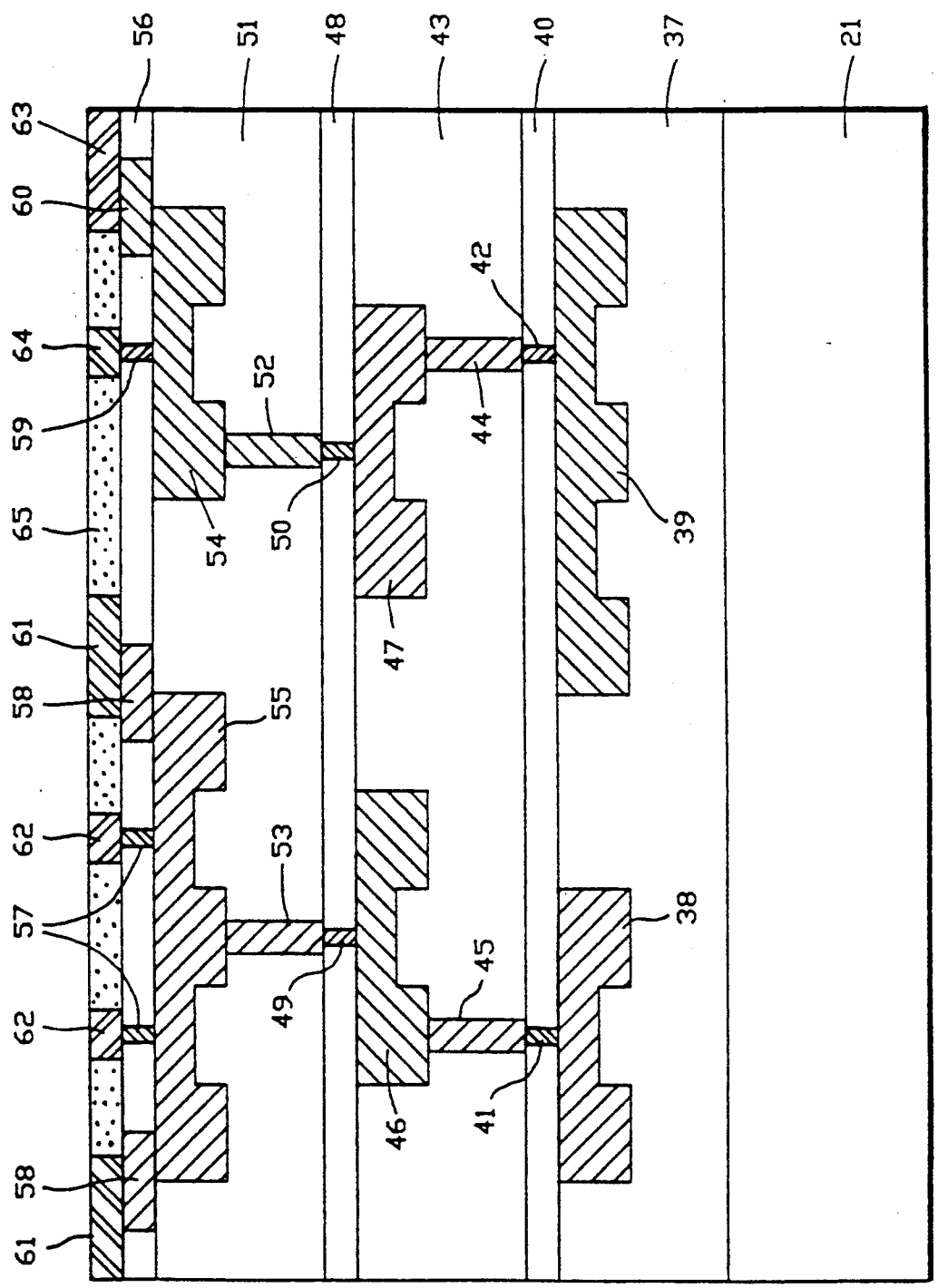
FIG. 14 is a cross section view of multi-layered integrated circuits.

The three dimensional integration, in both lateral and vertical directions, of short channel FETs is schematically shown in FIG. 14. GaAs layer 37 is formed under the same conditions as layer 22 of Example 5 and is intentionally undoped. The first level of an n-type active region 38 for an n-FET and a p-type active region 39 for a p-FET are fabricated in the same fashion as described in Example 5. Here, active region means the source, drain and channel of the FET. For an n-type active region, the channel region is fabricated by co-implantation of Ga+ and Si+ and source and drain regions in a similar way except that the Si ion dose is increased. For p-type region 39, the only alteration is that Si is substituted for the Be ion. The second undoped-GaAs layer 40 is then grown on top of layer 37, embedding the active regions 38 and 39. Layer 40 is grown under the same growth condition as layer 27 in Example 5.

The structure is transferred to the FIB chamber and a p-type gate region 41 and n-type gate region 42 are made in a manner similar to that shown in Example 5. Then, the third undoped-GaAs layer 43 is grown under the same conditions as layer 37. The second level of an n-type active region 47 for an n-FET and a p-type active region 46 for a p-FET are fabricated in the same way as for regions 38, 39. The contact region 44, which connects between gate region 42 and n-type active region 47, and region 45 which has opposite conductivity to that of region 44 are made by co-implantation of Ga and Si ions or Ga and Be ions.

This process is repeated for making undoped-GaAs layers 48, 51 and 56 and making n-type gate regions 49 and 59, p-type gate regions 50 and 57, n-type active region 55 and contacts 53 and 58, and p-type active region 54 and contacts 52 and 60. Electrical contacts 61 to 64 are formed through insulating layer 65 in the same manner as described in connection with Example 5.

The method described here can be repeatable for many more levels if it is required. In such integrated circuits, the size of each FET is quite small compared to FETs in conventional integrated circuits, because many bonding pads, which have 100 micron square areas, can be extremely reduced by adopting the three dimensional internal connections described above which may only be 1 micron square in area.

In three dimensional structures, low-power consumption is indispensable because it is very difficult to obtain good heat sinking in such structures. In this connection, another benefit of this structure is the low-power consumption of complimentary FET circuits. In this fabrication method, to obtain n- and p-type channels is quite simple; just change the source of ions to be implanted.

As mentioned in the above three examples, this invention provides a practical method for fabrication of short-channel FETs, of the normally-on and off varieties as well as complimentary FET circuits.

As also mentioned in the above examples, this invention provides a practical method for fabrication of micro structures such as quantum wire and dot structures and FETs of less than 0.1 micron gate length. Besides GaAs, similar effects are expected to occur in other III-V compound semiconductors and alloys, such as GaAlAs, (In,Ga)As and InP. For example, implantation of In+ ions also results in the elimination of As or P microcrystals and the consequent recovery of the original III-V compound.

While III-V compounds have been utilized herein to fabricate the various structures shown, it should be appreciated that other compound semiconductors such as II-VI compounds and their usual dopants may also be used in the practice of the present invention. For example, ZnSe containing Se microcrystals and/or point defects (doped with Al for n-type and N for p-type) may be implanted with Zn in specific regions to reform ZnSc upon annealing as an electronically active region. Other combinations including ternary and quaternary II-VI compounds will easily come to the minds of those skilled in the semiconductor arts.

In the above exposition, it should be noted that in most instances, it is the presence of excess amounts of the anionic component of a doped or undoped compound semiconductor which results in the formation of microcrystals and/or defects and that the cationic component of the compound semiconductor, in most instances, is ion implanted to compensate for the presence of the anionic microcrystals and/or defects. These components are then annealed to reform the original compound semiconductor. However, in some instances, either the anion or the cation may appear as the microcrystal and/or defect by depositing the compound semiconductor with an excess of either ion. In this instance, the element not in excess in the deposited layer would be implanted and annealed to reform the compound semiconductor. Cadmium Telluride is one such compound semiconductor material.

In connection with the formation of layers of high resistivity, the terms microcrystals and point defects have been used when one of the elements of a compound semiconductor appears in excess in a deposited layer of compound semiconductor. To the extent that microcrystals and point defects appear to differ only in the number of atoms of a particular atomic species with micro-crystals having a much greater number of atoms, both of these entities may be characterized as clusters of atoms. Thus, as claimed hereinbelow, the terms "clusters of atoms" or "clusters of one of the compound semiconductor elements" are intended to cover both microcrystals and point defects.

Having thus described our invention what we claim as new and desire to secure as Letters Patent, is:

1. A method for fabricating semiconductor devices comprising the steps of:
   depositing a layer of a compound semiconductor such that said layer contains clusters of one of said compound semiconductor elements which render said layer highly resistive, and
   converting the crystalline structure of said compound semiconductor in at least a discrete region of said layer to render said region conductive.

2. A method according to claim 1 wherein the step of depositing includes the steps of:
   forming by molecular beam expitaxy a layer of said compound semiconductor such that said clusters result from the presence of an excess of said one of said compound semiconductor elements in said layer.

3. A method according to claim 1 wherein the steps of converting includes the steps of:
   ion implanting the other of said compound semiconductor elements into said at least a discrete region, and, annealing said layer for a time at a temperature sufficient to reform said compound semiconductor.

4. A method according to claim 1 wherein said layer is doped with a conductivity-type determining impurity.

5. A method according to claim 1 wherein said compound semiconductor is one taken from Groups III and V of the Periodic Table of the Elements.

6. A method according to claim 1 wherein said compound semiconductor is one taken from Groups II and VI of the Periodic Table of the Elements.

7. A method according to claim 1 wherein said compound semiconductor includes ternary and quaternary alloys of said compound semiconductor.

8. A method according to claim 1 wherein said clusters of one of said compound semiconductor elements includes microcrystals of said one of said elements.

9. A method according to claim 1 wherein said cluster of one of said compound semiconductor elements includes point defects made of said one of said elements.

10. A method according to claim 1 wherein said compound semiconductor is gallium arsenide and said one of said compound semiconductor elements is arsenic.

11. A method according to claim 1 wherein said compound semiconductor is zinc selenide and said one of said compound semiconductor elements is selenium.

12. A method according to claim 3 further including the step of ion implanting a conductivity-type determining impurity simultaneously with the implanting of said other of said compound semiconductor elements.

13. A method according to claim 3 wherein said compound semiconductor is gallium arsenide, and said one of said compound semiconductor elements is arsenic and said other of said compound semiconductor elements is gallium.

14. A method according to claim 3 wherein said compound semiconductor is zinc selenide, said one of said compound semiconductor elements is selenium and said other of said compound semiconductor elements is zinc.

15. A method for fabricating semiconductor devices comprising the steps of:
depositing a layer of a compound semiconductor containing clusters of one of said compound semiconductor elements to render said layer substantially free of carriers, and
converting the crystalline structure of said compound semiconductor in at least a discrete region of said layer to activate said carriers in said region.

16. A method according to claim 15 wherein the step of depositing includes the step of:
forming a layer of said compound semiconductor by molecular beam epitaxy such that said clusters result from the presence of an excess of said one of said elements in said layer.

17. A method according to claim 15 wherein the step of converting includes the steps of:
ion implanting the other of said compound semiconductor elements into said at least a discrete region, and annealing said layer for a time and at a temperature sufficient to reform said compound semiconductor.

18. A method according to claim 15 wherein said layer is doped with a conductivity-type determining impurity.

19. A method according to claim 15 wherein said compound semiconductor is one taken from Groups III and V of the Periodic Table of the Elements.

20. A method according to claim 15 wherein said compound semiconductor is one taken from Groups II and VI of the Periodic Table of the Elements.

21. A method according to claim 15 wherein said compound semiconductor includes ternary and quaternary alloys of said compound semiconductor.

22. A method according to claim 15 wherein said clusters of one of said compound semiconductor elements includes microcrystals of said one of said elements.

23. A method according to claim 15 wherein said cluster of one of said compound semiconductor elements includes point defects made of said one of said elements.

24. A method according to claim 15 wherein said compound semiconductor is gallium arsenide and said one of said compound semiconductor elements is arsenic.

25. A method according to claim 15 wherein said compound semiconductor is zinc selenide and said one of said compound semiconductor elements is selenium.

26. A method according to claim 17 wherein said compound semiconductor is gallium arsenide, said one of said compound semiconductor elements is arsenic and said other of said compound semiconductor elements is gallium.

27. A method according to claim 17 wherein said compound semiconductor is zinc selenide, said one of said compound semiconductor elements is selenium and said other of said compound semiconductor elements is zinc.

28. A method according to claim 17 further including the step of ion implanting a conductivity-type determining impurity simultaneously with the implanting of said other of said compound semiconductor elements.

29. A method of fabricating a structure in a III-V compound layer, comprising the steps of:
(a) growing epitaxially on a substrate a III-V compound layer, the epitaxial growth parameters being controlled to produce group V element clusters embedded therein in such concentration that the grown layer becomes a carrier depletion layer;
(b) implanting ions including at least Group III element ions into a region of said III-V compound layer, the concentration of the implanted Group III element ions in the region being adjusted to compensate for the Group V element clusters; and
(c) annealing the ion implanted region whereby a region free from carrier depletion is formed therein.

30. A method according to claim 29 wherein the step of growing includes the step of doping said layer with a conductivity-type determining impurity.

31. A method according to claim 29 wherein the step of implanting includes the step of ion implanting a conductivity-type determining impurity into said region simultaneously with the implanting of said Group III element ions.

32. A method according to claim 29 wherein the step of ion implanting includes the step of ion implanting Group III and Group II element ions into said layer to form at least a n-conductivity region in said layer.

33. A method according to claim 29 wherein the step of ion implanting includes the step of ion implanting Group III and Group II element ions into said layer to form at least a p-conductivity region in said layer.

34. A method of fabricating an electronic device including at least one FET with source, drain, gate and channel regions comprising the steps of:

growing epitaxially on a substrate a first III-V compound semiconductor layer, the epitaxial growth parameters being controlled to produce Group V element clusters embedded therein in such concentration that the grown layer becomes a carrier depletion layer;

implanting ions including at least Group III element ions into regions of said III-V compound layer, the concentration of the implanted Group III element ions in the region being adjusted to compensate for the Group V element clusters;

growing on said first III-V compound layer a second III-V compound layer like said first layer;

implanting ions including at least Group III element ions into regions of said second III-V compound layer, the concentration of the implanted Group III element ions in the region being adjusted to compensate for the Group V element clusters, and annealing the ion implanted regions, to form said source, said drain, and said channel regions free from carrier depletion in said first layer and a gate region over said channel region and ohmic contact regions over said source and drain regions free from carrier depletion in said second layer.

35. The method of claim 34, further including the steps of:

growing an insulating layer on said second III-V compound layer, and forming in said insulating layer ohmic contact regions over said gate region and said ohmic contact regions which are formed in said second III-V compound layer.

* * * * *